United States Patent
Takemoto

(10) Patent No.: US 10,439,521 B2
(45) Date of Patent: Oct. 8, 2019

(54) BRUSHLESS DC MOTOR, AND IDENTIFICATION METHOD AND IDENTIFICATION APPARATUS OF IDENTIFYING TYPE OF BRUSHLESS DC MOTOR

(71) Applicant: Nidec Corporation, Kyoto (JP)

(72) Inventor: Hideyuki Takemoto, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 15/963,584

(22) Filed: Apr. 26, 2018

(65) Prior Publication Data

US 2018/0316288 A1    Nov. 1, 2018

(30) Foreign Application Priority Data

May 1, 2017  (JP) .................. 2017-091265

(51) Int. Cl.
| | | |
|---|---|---|
| H02P 6/12 | (2006.01) |
| G01R 19/10 | (2006.01) |
| G01R 1/28 | (2006.01) |
| G01R 31/34 | (2006.01) |

(52) U.S. Cl.
CPC ............... H02P 6/12 (2013.01); G01R 1/28 (2013.01); G01R 19/10 (2013.01); G01R 31/34 (2013.01)

(58) Field of Classification Search
CPC ................................. H02P 6/12; G01R 19/10
USPC ................. 318/400.3, 400.01, 700
See application file for complete search history.

(56) References Cited

U.S. PATENT DOCUMENTS

| | | | |
|---|---|---|---|
| 5,835,676 A * | 11/1998 | Komatsu .......... | H02P 7/29 388/811 |
| 6,545,438 B1 | 4/2003 | Mays, II | |
| 7,612,508 B2 | 11/2009 | Jreij et al. | |
| 7,844,750 B2 | 11/2010 | Pearce et al. | |
| 8,198,843 B2 * | 6/2012 | Kitagawa .......... | H02P 27/08 318/400.06 |
| 9,831,854 B2 * | 11/2017 | Nishimura .......... | H02P 31/00 |
| 2011/0320043 A1 | 12/2011 | Mikuszewski et al. | |

FOREIGN PATENT DOCUMENTS

| | | |
|---|---|---|
| JP | 08-23692 A | 1/1996 |
| JP | 2003-102195 A | 4/2003 |

\* cited by examiner

*Primary Examiner* — David Luo
(74) *Attorney, Agent, or Firm* — Keating & Bennett, LLP

(57) ABSTRACT

Provided is an identification method for use in an identification apparatus that identifies types of brushless DC motors. Each brushless DC motor includes a circuit board on which at least one terminal with a pull-up resistance incorporated therein is mounted. The pull-up resistances vary among multiple types of brushless DC motors. A power supply voltage is supplied from the identification apparatus to a brushless DC motor, a pull-up voltage value set by the pull-up resistance and outputted from the at least one terminal of the brushless DC motor is inputted to the identification apparatus, and the identification apparatus identifies the type of the brushless DC motor based on the pull-up voltage value.

13 Claims, 14 Drawing Sheets

[Fig. 1]
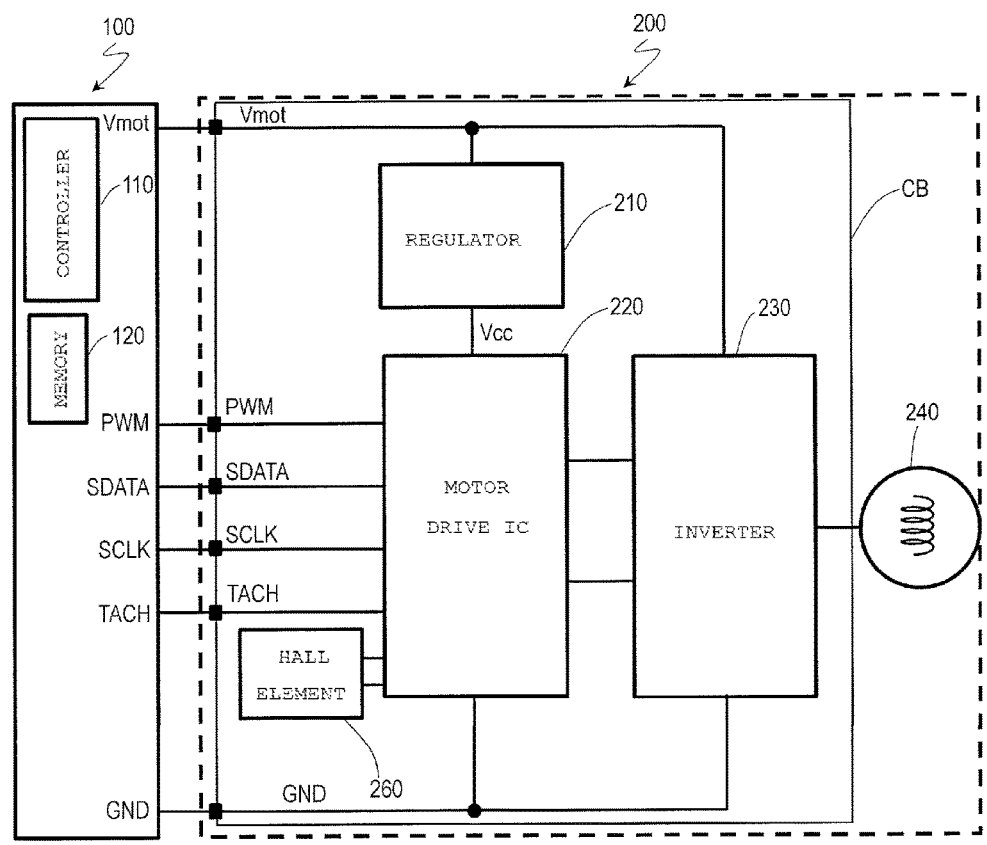

[Fig. 2 A]
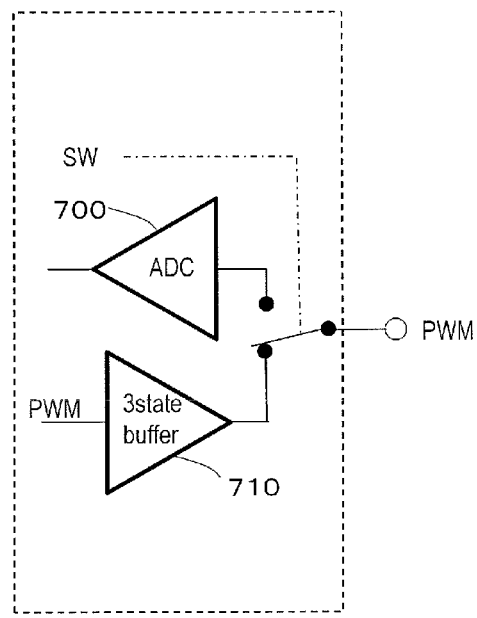

[Fig. 2 B]
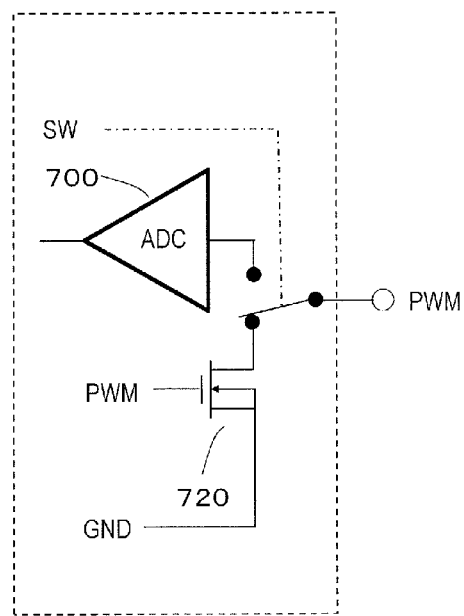

【Fig. 2 C】
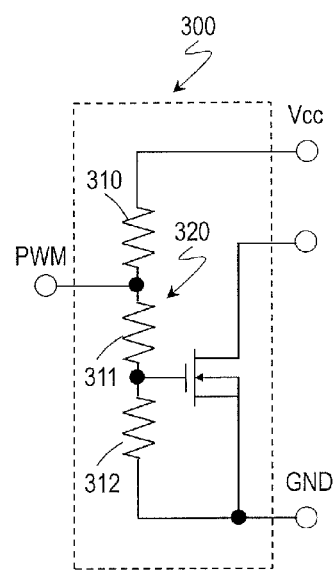

[Fig. 3]
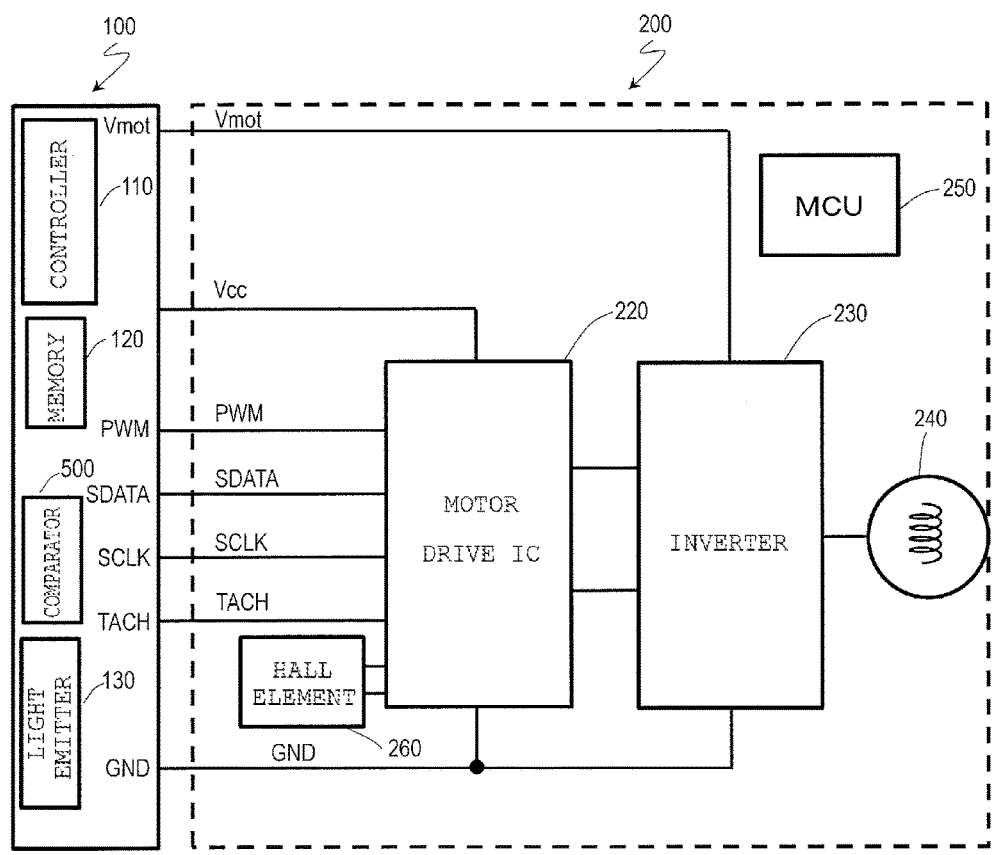

[Fig. 4]
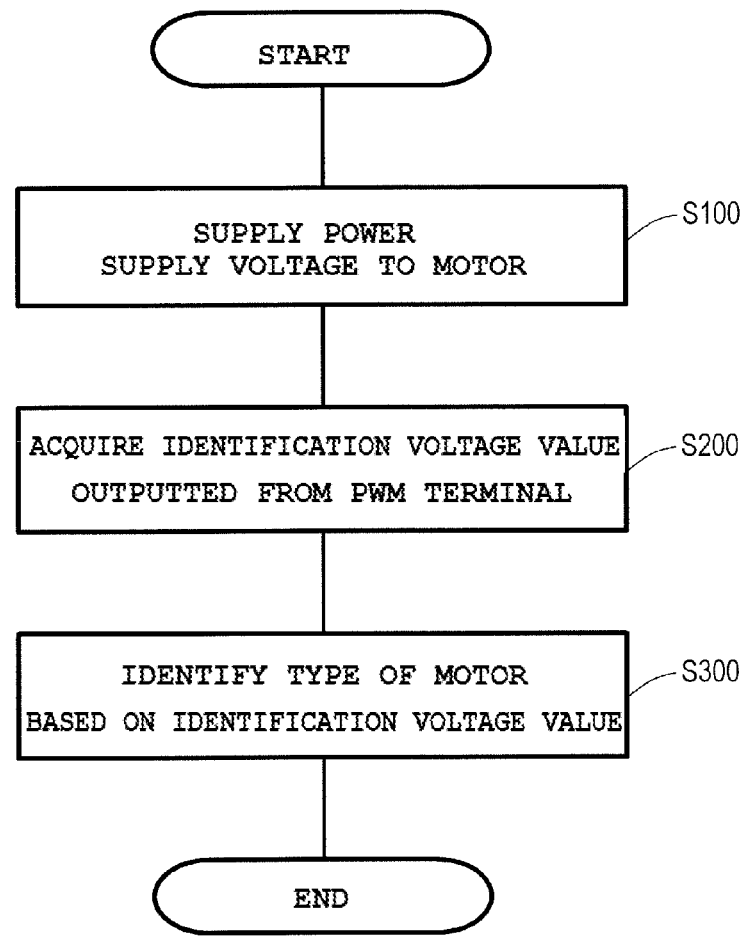

[Fig. 5 A]
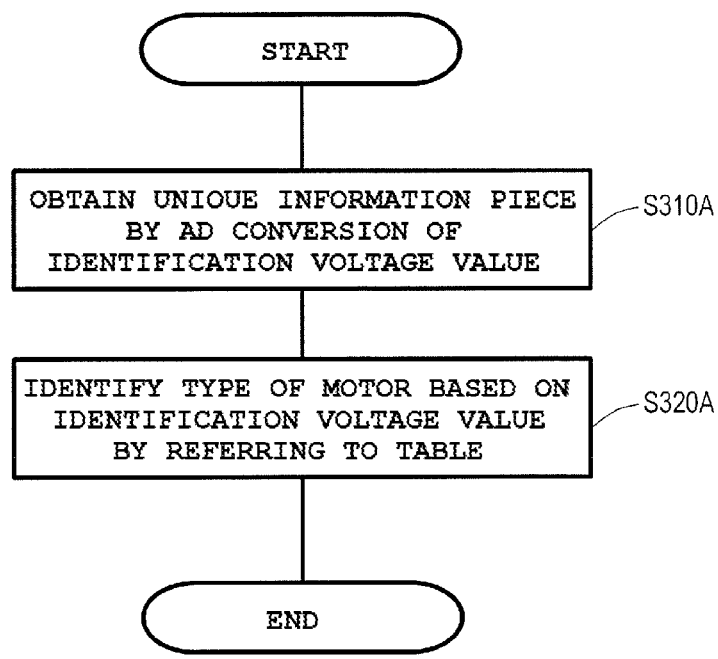

[Fig. 5 B]

| TYPE OF BRUSHLESS DC MOTOR | UNIQUE INFORMATION PIECE |
|---|---|
| 3'b001//SUPPLIER A | 10'h27A TO 10'h2A3 |
| 3'b010//SUPPLIER B | 10'h251 TO 10'279 |
| 3'b011//SUPPLIER C | 10'h228 TO 10'h250 |

【Fig. 6】
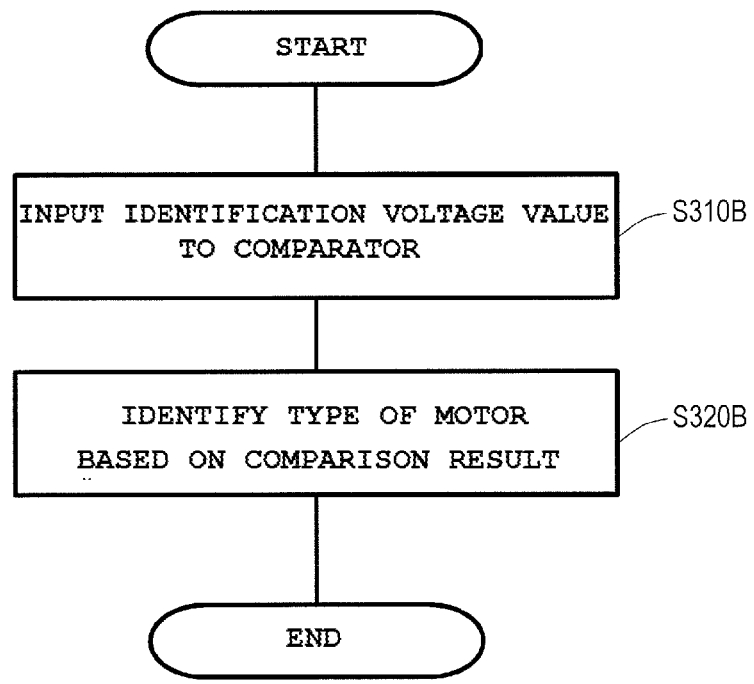

[Fig. 7]
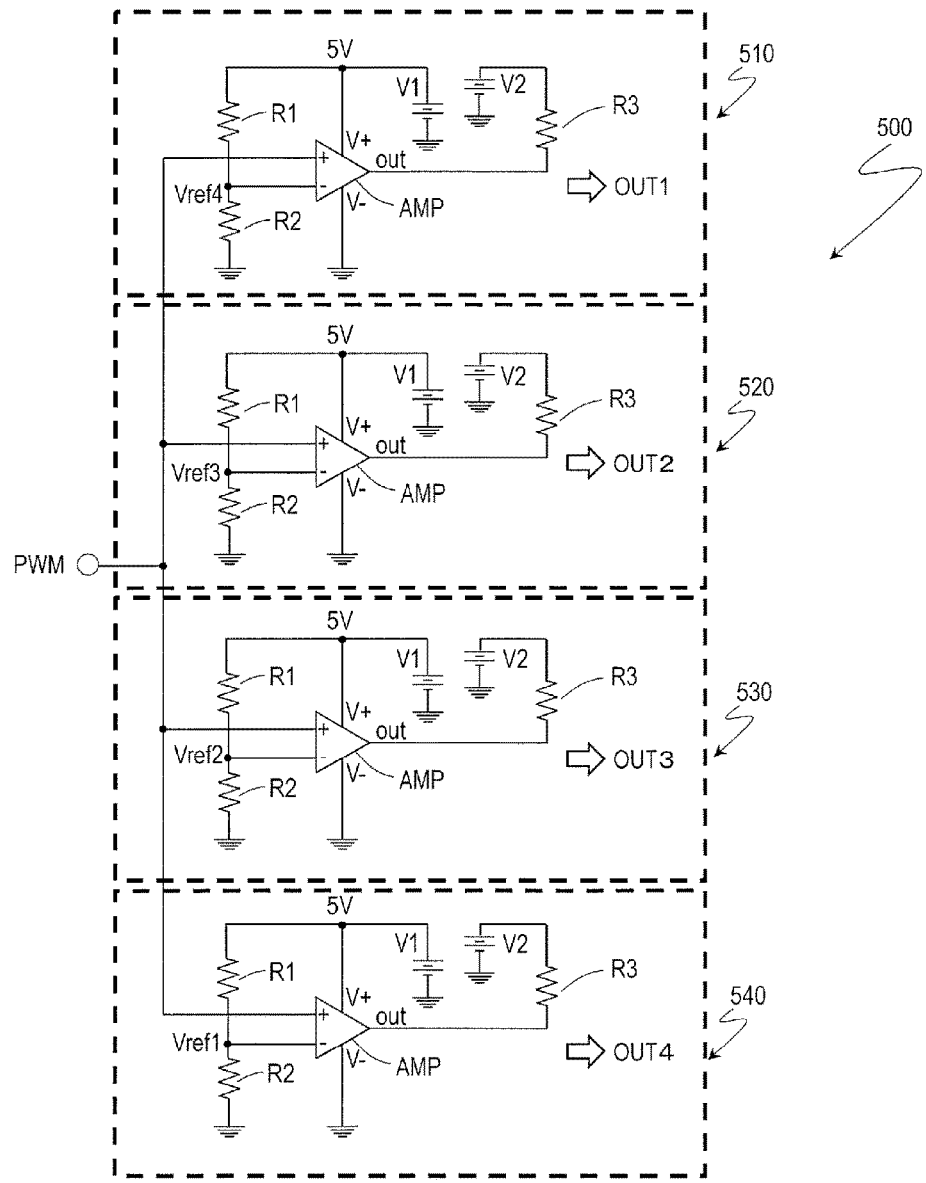

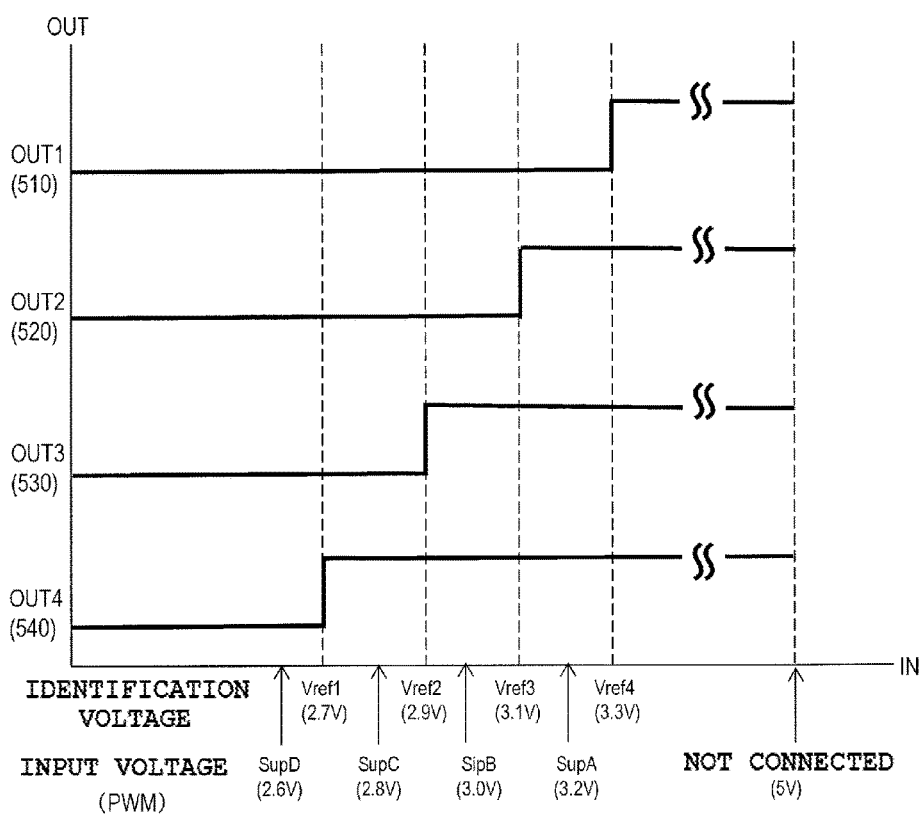
[Fig. 8]

[Fig. 9]
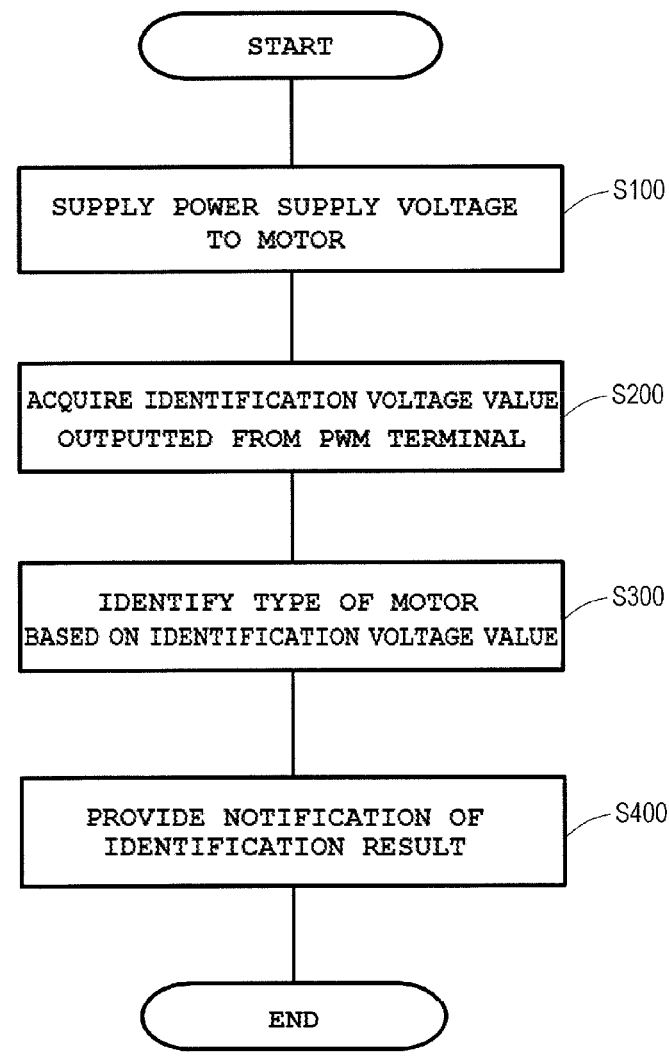

[Fig. 10]
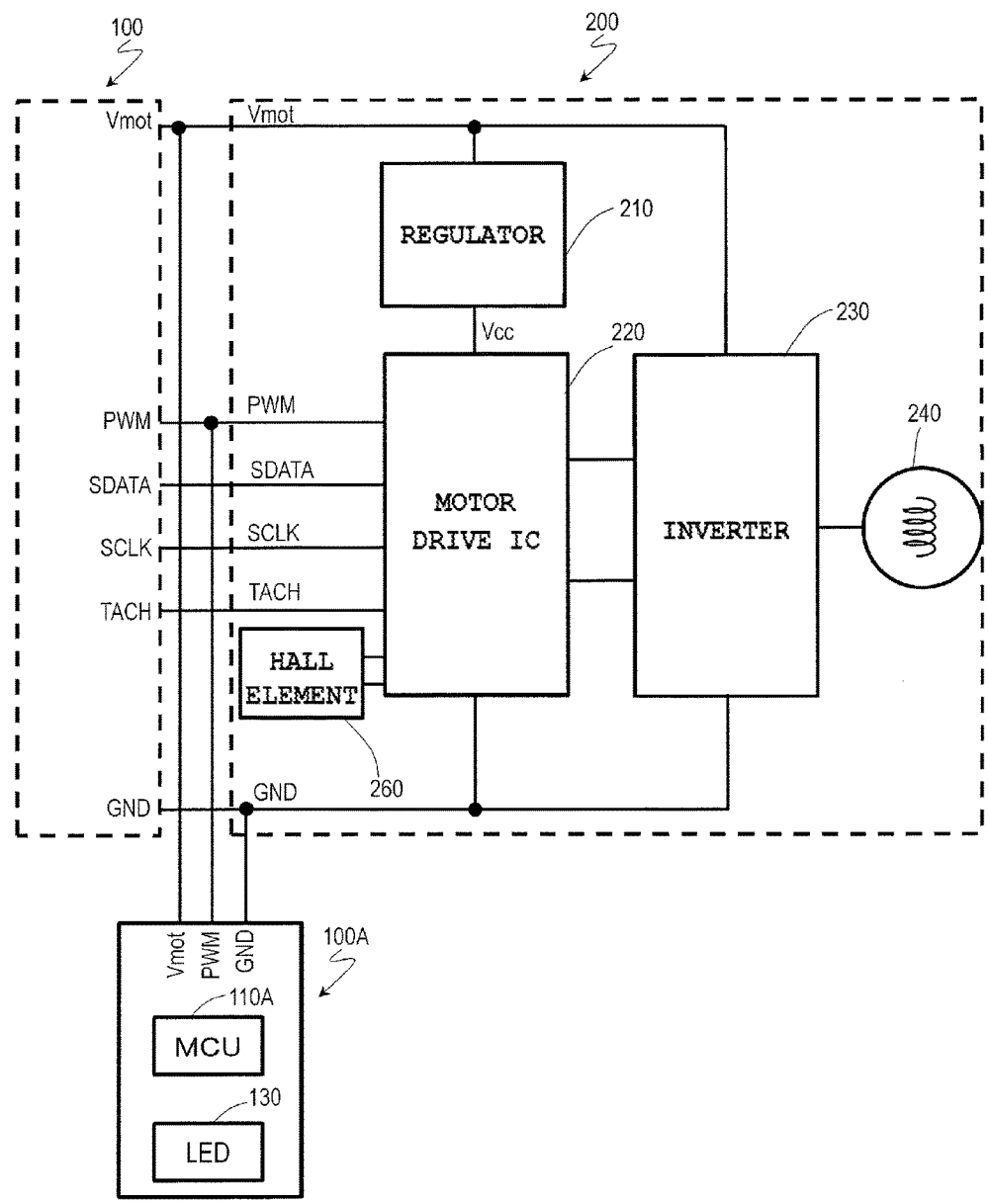

[Fig. 11]
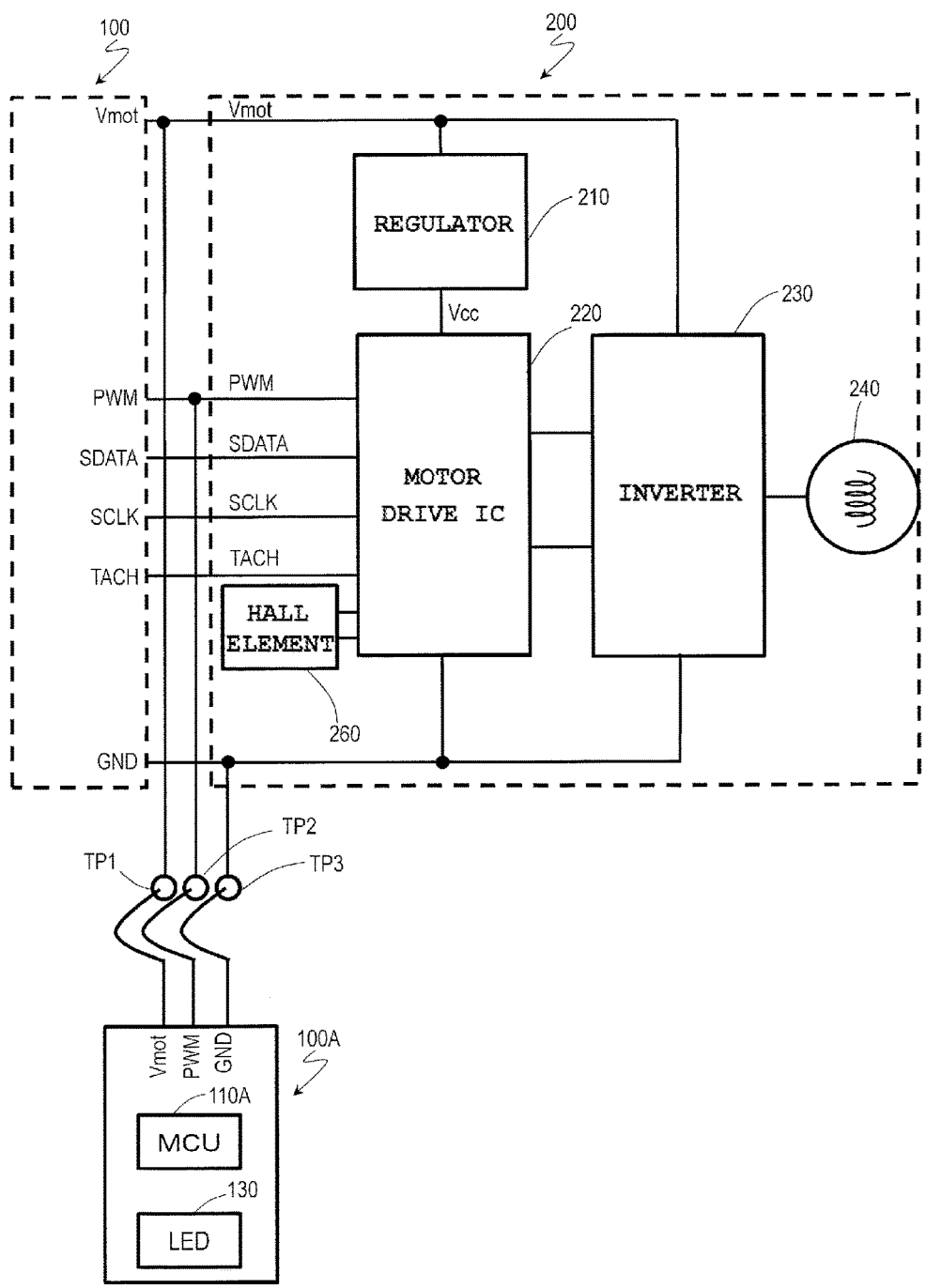

BRUSHLESS DC MOTOR, AND IDENTIFICATION METHOD AND IDENTIFICATION APPARATUS OF IDENTIFYING TYPE OF BRUSHLESS DC MOTOR

CROSS REFERENCE TO RELATED APPLICATIONS

This application claims the benefit of priority to Japanese Patent Application No. 2017-091265 filed on May 1, 2017. The entire contents of this application are hereby incorporated herein by reference.

BACKGROUND OF THE INVENTION

1. Field of the Invention

The present disclosure relates to a brushless DC motor, and an identification method and an identification apparatus of identifying a type of brushless DC motor.

2. Description of the Related Art

A large number of electronic apparatuses are equipped with, for example, fan motors as cooling devices for releasing heat generated inside to the outside. In the electronic apparatus, the fan motor is electrically connected to a system controller, and operates under the control of the system controller.

US Laid-open Patent Publication No. 2006/0152891 discloses an identification method of allowing a system controller to acquire fan identification information through communications with a fan motor. For example, upon switching from a normal operating mode to a command mode, the fan motor and the system controller exchange commands via a power supply line, a pulse width modulation (PWM) line, and a tachometer (TACH) line. The system controller acquires the fan identification information by handshaking, and determines the compatibility of the fan motor. In this case, both of the system controller and the fan need to be equipped with complicated software for operations such as switching between the normal operating mode and the command mode.

With regard to the above conventional technique, there has been a demand for a method of more easily identifying each of types of brushless DC motors.

SUMMARY OF THE INVENTION

An embodiment of the present disclosure provides a brushless DC motor identification method and an identification apparatus that are capable of identifying types of brushless DC motors without performing handshaking in particular.

An exemplary identification method of the present disclosure is an identification method for use in an identification apparatus that identifies a type of brushless DC motor. The brushless DC motor includes a circuit board on which at least one terminal with a pull-up resistance incorporated therein is mounted. The pull-up resistances vary among a plurality of types of brushless DC motors. The identification method includes: supplying a power supply voltage from the identification apparatus to the brushless DC motor; inputting a pull-up voltage value to the identification apparatus, the pull-up voltage value set by the pull-up resistance and outputted from the at least one terminal of the brushless DC motor; and identifying a type of the brushless DC motor based on the pull-up voltage value.

An identification apparatus of the present disclosure is an identification apparatus that identifies a type of brushless DC motor. The brushless DC motor includes a circuit board on which at least one terminal with a pull-up resistance incorporated therein is mounted. The pull-up resistances vary among a plurality of types of brushless DC motors. The identification apparatus includes: a power supply terminal that supplies a power supply voltage to the brushless DC motor; an input/output terminal that is connected to the at least one terminal of the circuit board; and a controller that identifies the type of the brushless DC motor. The controller acquires, via the input/output terminal, a pull-up voltage value set by the pull-up resistance and outputted from the at least one terminal of the circuit board when the power supply voltage is supplied to the brushless DC motor via the power supply terminal. The controller identifies the type of the brushless DC motor based on the pull-up voltage value.

An exemplary brushless DC motor of the present disclosure includes: a circuit board; at least one terminal that is mounted on the circuit board and that includes a pull-up resistance incorporated therein; a coil; and a drive circuit that causes electricity to flow through the coil. The pull-up resistances vary among a plurality of types of brushless DC motors.

According to the exemplary embodiments of the present disclosure, brushless DC motors are equipped with specific resistances that vary among the types of brushless DC motors, and the identification voltage value set by the specific resistance is inputted to the identification apparatus. This makes it possible to provide a brushless DC motor identification method and identification apparatus that are capable of identifying types of brushless DC motors without performing handshaking in particular.

The above and other elements, features, steps, characteristics and advantages of the present disclosure will become more apparent from the following detailed description of the preferred embodiments with reference to the attached drawings.

BRIEF DESCRIPTION OF THE DRAWINGS

FIG. 1 is a block diagram schematically illustrating a typical block configuration example of a user system and a brushless DC motor according to exemplary Embodiment 1.

FIG. 2A is a circuit diagram illustrating a circuit configuration of a PWM terminal of the user system.

FIG. 2B is a circuit diagram illustrating another circuit configuration of the PWM terminal of the user system.

FIG. 2C is a circuit diagram illustrating a circuit configuration of a PWM terminal of the brushless DC motor.

FIG. 3 is a block diagram schematically illustrating another block configuration example of the user system and the brushless DC motor.

FIG. 4 is a flowchart illustrating an identification method of identifying a type of brushless DC motor according to exemplary Embodiment 1.

FIG. 5A is a flowchart illustrating a specific processing flow in step S300 of identifying a type of brushless DC motor based on an identification voltage value.

FIG. 5B is a schematic diagram illustrating contents in a table used for identification FIG. 6 is a flowchart illustrating another example of a specific processing flow in step S300 of identifying a type of brushless DC motor based on an identification voltage value.

FIG. 7 is a circuit diagram illustrating an implementation example of a circuit configuration of a comparator.

FIG. 8 is a graph presenting output waveforms for explaining an operation of the comparator.

FIG. 9 is a flowchart illustrating another specific example of the identification method of identifying a type of brushless DC motor.

FIG. 10 is a block diagram schematically illustrating a typical block configuration example of a user system, an identification apparatus, and a brushless DC motor according to exemplary Embodiment 2.

FIG. 11 is a block diagram schematically illustrating another block configuration example of the user system, the identification apparatus, and the brushless DC motor according to exemplary Embodiment 2.

DETAILED DESCRIPTION OF THE PREFERRED EMBODIMENTS

Hereinafter, with reference to the accompanying drawings, detailed description is provided for embodiments of an identification method and an identification apparatus for identifying types of brushless DC motors according to the present disclosure. In order to prevent unnecessarily redundant description from being provided below and to facilitate the understanding by those skilled in the art, the description detailed more than necessarily may be omitted for some matters. For example, detailed explanation of well-known matters and repetitive description of substantially the same configurations are omitted in some cases.

FIG. 1 schematically illustrates a typical block configuration example of a user system 100 and a brushless DC motor 200 according to Embodiment 1. In the present specification, the configuration and operations of the brushless DC motor 200 are described by taking a fan motor as an example. Brushless DC motors of the present disclosure include a motor of an inner rotor type or an outer rotor-type motor. The brushless DC motor 200 is not limited to the fan motor, but may be any of brushless DC motors for use for various purposes. The brushless DC motor 200 is, for example, a motor used for a home appliance such as an air conditioner or a washing machine, or an in-vehicle motor.

The user system 100 is electrically connected to the brushless DC motor 200. The user system 100 is capable of controlling the brushless DC motor 200. The user system 100 may be mounted on a management system for brushless DC motor manufacturing in a factory where a wide variety of motors are manufactured. Instead, the user system 100 may be a system in an electronic apparatus or be an in-vehicle system, in which the brushless DC motor 200 is installable. For example, the brushless DC motor 200 is favorably mounted in an electronic apparatus such as a server, a main body of a desktop type personal computer, or a game device. For example, when brushless DC motors 200 under different specifications are manufactured in the same location, the user system 100 is a part of a series of inspection systems. Instead, when the brushless DC motor 200 is mounted as a fan motor in a server or a main body of a desktop type personal computer, the user system 100 is the whole or a part of a system composed of various electronic components mounted on the mother board.

The user system 100 includes, for example, a controller 110 and a memory 120. The user system 100 according to the present embodiment has a function to identify types of brushless DC motors 200 as described later. In other words, the user system 100 is usable as an identification apparatus that identifies types of brushless DC motors 200. For this reason, in the present specification, the user system 100 is also referred to as an identification apparatus 100 in some cases.

The controller 110 is capable of controlling the whole of the user system 100 and the brushless DC motor 200. The controller 110 is further capable of identifying a type of the brushless DC motor 200. The controller 110 is a semiconductor integrated circuit such, for example, as a micro control unit (MCU) or a field programmable gate array (FPGA).

The memory 120 is, for example, a writable memory (for example a PROM), a rewritable memory (for example, a flash memory), or a read-only memory. The memory 120 stores a control program containing a group of commands causing the controller 110 to control the brushless DC motor 200. The memory 120 further stores a control program containing a group of commands causing the controller 110 to identify types of brushless DC motors 200. For example, these control programs are once loaded on a RAM (not illustrated) during booting. Note that the memory 120 does not have to be an external memory connected to the controller 110, but may be mounted in the controller 110. The controller 110 in which the memory 120 is mounted is, for example, an MCU mentioned above.

The user system 100 includes terminals for controlling the brushless DC motor 200, called, for example, a Vmot terminal, a PWM terminal, a TACH terminal, and a GND terminal. The user system 100 may optionally include an SDATA terminal, an SCLK terminal, a CW/CCW terminal to control the rotation direction of the motor, a START/STOP terminal to instruct the motor to start or stop rotating, and so on. In the present embodiment, the rotation of the motor means the rotation of the fan motor (or the fan).

The Vmot terminal is a terminal for a motor power supply. For example, a power supply voltage at 52 V is supplied from the Vmot terminal to the brushless DC motor 200.

The PWM terminal is a terminal to control the number of rotations of the motor. The controller 110 generates a PWM signal to control the rotations of the motor, and outputs the PWM signal to the brushless DC motor 200 through the PWM terminal. The PWM terminal is used as an output terminal when the brushless DC motor 200 is in operation. In addition, the PWM terminal also serves as an input terminal to receive an identification voltage value in the process of identifying a type of brushless DC motor 200 to be described later.

FIG. 2A illustrates a circuit configuration of the PWM terminal. FIG. 2B illustrates another circuit configuration of the PWM terminal. For example, the PWM terminal is an input/output terminal including an AD converter 700 and a 3-state buffer 710 as illustrated in FIG. 2A. Instead, the PWM terminal is an input/output terminal including an AD converter 700 and a switching element 720 as illustrated in FIG. 2B. The input and output of the PWM terminal are switched according to an SW signal from the controller 110, for example.

The TACH terminal is an input terminal for tachometer to monitor the rotational speed of the motor. The rotational speed is expressed as the number of rotations (rpm) at which the motor rotates per unit time (one minute) or the number of rotations (rps) at which the motor rotates per unit time (one second). For example, the TACH terminal of the fan motor generally outputs two pulses per rotation of the motor. A pulse signal outputted according to the rotational speed of the motor from the TACH terminal of the brushless DC motor 200 is inputted to a TACH terminal of the user system 100. The TACH terminal is not needed in the process of identifying a type of brushless DC motor 200.

The SDATA terminal and the SCLK terminal are input/output terminals for performing I2C communications. The SDATA terminal and the SCLK terminal are not indispensable terminals. The user system 100 and the brushless DC motor 200 are enabled to perform serial communications therebetween through the SDATA terminals and the SCLK terminals.

The brushless DC motor 200 is, for example, a DC fan including an impeller. The brushless DC motor 200 is, for example, an axial fan, a centrifugal fan, a cross-flow fan, or a sirocco fan. The brushless DC motor 200 typically includes a regulator 210, a motor drive IC 220, an inverter 230, a circuit board CB on which these electronic components are mounted, a coil 240, and a Hall element 260. For example, the regulator 210, the motor drive IC 220, the inverter 230, and the Hall element 260 constitute a drive circuit that drives the motor by causing electricity to flow through the coil 240.

The regulator 210 lowers the motor power supply voltage at 52 V, for example, to generate a power supply voltage Vcc (for example, 5 V) for the motor drive IC 220. Here, the regulator 210 is not indispensable. Instead, for example, in addition to a motor power supply voltage Vmot, a power supply voltage Vcc may be supplied from the user system 100 to the brushless DC motor 200 as described later.

The motor drive IC 220 is connected to the inverter 230. The motor drive IC 220 generates a control signal to control the inverter 230, in accordance with the PWM signal transmitted from the user system 100. The motor drive IC 220 includes an SDATA terminal and an SCLK terminal, and is capable of performing I2C communications with the user system 100.

The motor drive IC 220 monitors the rotational speed of the motor based on outputs from the Hall element 260, and generates a pulse signal according to the rotational speed of the motor, for example. The output method is, for example, to output two pulses per rotation. In this connection, a technique of generating a TACH signal without using a Hall element has been known. In the case of using such a technique, the Hall element 260 is not needed.

The inverter 230 is electrically connected to the motor drive IC 220 and the coil 240 of the motor. The inverter 230 converts the power of the motor power supply to the power to be supplied to the fan motor, and causes the obtained power to flow into the coil 240.

The coil 240 is a winding of the motor.

The brushless DC motor 200 includes a circuit board CB on which, for example, a Vmot terminal, a PWM terminal 300, an SDATA terminal, an SCLK terminal, a TACH terminal, and a GND terminal respectively corresponding to the terminals of the user system 100 are mounted.

In the brushless DC motor 200, the PWM terminal 300 is an input/output terminal, whereas the TACH terminal is an output terminal.

FIG. 2C schematically illustrates a circuit configuration of the PWM terminal 300 of the brushless DC motor 200.

The PWM terminal 300 of the brushless DC motor 200 is an input/output terminal. The PWM terminal 300 includes a pull-up resistance 310 incorporated therein. The pull-up resistance 310 and the resistors 311 and 312 constitute a voltage divider circuit 320. A node between the resistors 311 and 312 is connected to a switching element. For example, a resistance value of the resistor 311 is 4.7 kΩ and a resistance value of the resistor 312 is 43.0 kΩ. In the present specification, the resistors 311, 312 are referred to as pull-down resistances in some cases.

The pull-up resistance 310 is a specific resistance for identifying a brushless DC motor. The pull-up resistances 310 vary among multiple types of brushless DC motors. For example, a certain resistance value Rpu of the pull-up resistance 310 may be exclusively allocated to each of suppliers that manufacture brushless DC motors. For example, it is possible to allocate a pull-up resistance 310 at 27 kΩ, to a supplier A, and allocate a pull-up resistance 310 at 31.8 kΩ, to a supplier B. Then, it is possible to allocate a pull-up resistance 310 at a resistance value Rpu different from the above values to a supplier C. Moreover, it is possible to allocate pull-up resistances 310 at resistance values Rpu different from the above values to multiple suppliers, respectively.

As another example, it is possible to exclusively allocate a resistance value Rpu of a pull-up resistance 310 to each product lot. For example, it is possible to allocate a pull-up resistance 310 at 27 kΩ, to a product lot number A, and allocate a pull-up resistance 310 at 31.8 kΩ, to a product lot number B. Then, it is possible to allocate a pull-up resistance 310 at a resistance value Rpu different from the above values to a product lot number C. Moreover, it is possible to allocate pull-up resistances 310 at resistance values Rpu different from the above values to multiple product lot numbers, respectively. In this way, the number of multiple types of brushless DC motors existing is equal to the number of suppliers or the number of product lots to be managed, for example.

When a power supply voltage Vcc (for example 5 V) is inputted, a pull-up voltage value Vpu is outputted from the PWM terminal 300. The pull-up voltage value Vpu is set by the pull-up resistance 310. In other words, the pull-up voltage value Vpu is given by a function of the resistance value Rpu of the pull-up resistance 310. The pull-up voltage values Vpu vary among the multiple brushless DC motors depending on the resistance values Rpu of the pull-up resistances 310. The pull-up voltage value Vpu is at a potential level of a node connecting the pull-up resistance 310 and the pull-down resistance 311, and is expressed by Formula (1). The identification apparatus 100 can identify a type of brushless DC motor 200 by measuring the pull-up voltage value Vpu set by the resistance value Rpu. Here, Rpd is a combined resistance of the pull-down resistances 311, 312.

$$Vpu = Vcc \times [Rpd/(Rpu+Rpd)] \quad \text{Formula(1)}$$

FIG. 3 schematically illustrates another block configuration example of the user system 100 and the brushless DC motor 200.

The user system 100 may further include, for example, multiple light emitted diodes (LED) 130 as light emitters. The multiple LEDs 130 constitute a notification device that provides a notification of an identification result of the type of brushless DC motor 200. For example, the number of LEDs 130 provided may be equal to the number of types of brushless DC motors. If there are two types of brushless DC motors of the suppliers A and B, for example, two LEDs having emitted light of different colors, for example, may be provided. For example, it is possible to use a red LED for the supplier A, and a blue LED for the supplier B. The user system 100 may further include a comparator 500 to be described later.

The brushless DC motor 200 may include an MCU 250. Equipped with the MCU 250, the brushless DC motor 200 can be made intelligent. For example, the MCU 250 enables direct control of the motor drive IC 220. In addition, as described above, the brushless DC motor 200 does not have to include the regulator 210. In this case, for example, the power supply voltage Vcc for the motor drive IC 220 is supplied from the user system 100.

FIG. 4 illustrates a flowchart of an identification method of identifying a type of brushless DC motor.

The identification method according to the present embodiment is, for example, a method used in the identification apparatus 100. In general, each of processes of manufacturing a wide variety of products equipped with motors requires identification of types of brushless DC motors 200 in order to prevent different types of motors from being included into the process. For example, the identification method of the present disclosure is advantageously applied to a method of inspecting the compatibility of a brushless DC motor 200 with the user system 100 during product manufacturing in a factory. For example, the process of inspecting the compatibility of a brushless DC motor 200 is one of product manufacturing processes.

(Step S100) First, in the state where the terminals of the identification apparatus 100 (user system 100) and the brushless DC motor 200 are electrically connected to each other, the identification apparatus 100 supplies a motor power supply voltage Vmot to the brushless DC motor 200. Instead, in the configuration example illustrated in FIG. 3, the identification apparatus 100 may supply the brushless DC motor 200 with a power supply voltage Vcc for the motor drive IC 220 together with the motor power supply voltage Vmot. However, without needing driving of the motor, the identification method of the present disclosure does not necessarily have to supply the motor power supply voltage Vmot to the inverter 230.

For example, upon input of the power supply, the electronic components in the brushless DC motor 200 perform an initialization operation such as a reset operation. After the completion of the initialization operation, the regulator 210, the motor drive IC 220, and the inverter 230 are supplied with the stable power supply voltages. The pull-up resistance 310 of the PWM terminal 300 is pulled up by the power supply voltage Vcc. Thus, the pull-up voltage value Vpu set by the pull-up resistance 310 is outputted from the PWM terminal 300.

(Step S200) The pull-up voltage value Vpu outputted from at least one terminal of a brushless DC motor is inputted as an identification voltage value to the identification apparatus 100. In the present embodiment, the pull-up voltage value Vpu outputted from the PWM terminal 300 of the brushless DC motor 200 is inputted to the PWM terminal of the identification apparatus 100. The terminal from which the pull-up voltage value Vpu is outputted is not limited to the PWM terminal, but may be any terminal that is used as an input terminal when the brushless DC motor 200 is in operation, and that includes a pull-up resistance incorporated therein. For example, in general, the SDATA terminal and the SCLK terminal as terminals for I2C include pull-up resistances, and have circuit configurations illustrated in FIG. 2C. For this reason, a pull-up resistance may be incorporated as a specific resistance in at least one of the SDATA terminal and the SCLK terminal. Then, the pull-up voltage value Vpu outputted from the terminal may be inputted to the identification apparatus 100.

(Step S300) The identification apparatus 100 acquires the pull-up voltage value Vpu as the identification voltage value. The identification apparatus 100 identifies a type of brushless DC motor 200 based on the identification voltage value.

FIG. 5A illustrates an example of a specific processing flow in step S300 of identifying a type of brushless DC motor 200 based on an identification voltage value.

(Step S310A) In the example in FIG. 5A, the identification apparatus 100 obtains a unique information piece by AD conversion of the identification voltage. For example, the controller 110 of the identification apparatus 100 is capable of performing AD conversion. The controller 110 converts the identification voltage that is an analog signal into a digital signal. In the present specification, the digital signal obtained by the AD conversion is referred to as a unique information piece of the brushless DC motor 200. The resolution of the AD conversion is 10 bits, for example.

(Step S320A) The controller 110 of the identification apparatus 100 can identify the type of brushless DC motor 200 to be identified based on the obtained unique information piece by referring to a table. FIG. 5B illustrates contents in a table used for identification. The table is a lookup table (LUT) in which multiple types of brushless DC motors are associated with multiple unique information pieces of brushless DC motors. The table is stored in the memory 120, for example. As described above, the multiple types of brushless DC motors are present for the respective suppliers, for example, and there are three types of the suppliers A, B and C, for example. For example, a type of motor may be expressed with a 3-bit digital signal. Each of the unique information pieces may be expressed by a digital value with the same bit width as the resolution of the AD conversion.

Multiple unique information pieces of brushless DC motors are allocated to multiple types of brushless DC motors. When the resistance value of the resistor 311 is set to 4.7 kΩ, the resistance value of the resistor 312 is set to 43.0 kΩ, and the pull-up voltage Vcc is set to 5 V, for example, a pull-up resistance 310 having 27 kΩ with which a pull-up voltage value Vpu at 3.2 V is obtained may be allocated to the supplier A, for example. For example, a pull-up resistance 310 having 31.8 kΩ with which a pull-up voltage value Vpu at 3.0 V is obtained may be allocated to the supplier B, for example. For example, a pull-up resistance 310 having 37.5 kΩ with which a pull-up voltage value Vpu at 2.8 V is obtained may be allocated to the supplier C, for example.

Each of the multiple unique information pieces of brushless DC motors has a digital value obtained by AD conversion. FIG. 5B illustrates a range and identification of each set of unique values. The unique information pieces obtained by the AD conversion do not have overlap among the multiple types of brushless DC motors.

According to the method of creating the table in the present embodiment, each type of brushless DC motor 200 can be appropriately associated with unique information pieces in the table. This enables identification of a type of brushless DC motor 200 with an allowable margin given to a digital value obtained for the identification.

As another method of identifying a type of brushless DC motor 200, there is an identification method using a comparator in place of the AD conversion.

FIG. 6 illustrates another example of a specific processing flow in step S300 of identifying a type of brushless DC motor 200 based on an identification voltage value. FIG. 7 schematically illustrates an implementation example of a circuit configuration of the comparator 500. FIG. 8 presents output waveforms for explaining an operation by the comparator 500.

The comparator 500 includes four detectors 510, 520, 530, and 540. In this example, there are four types of brushless DC motors 200 (for example, suppliers A, B, C, and D). For example, the detector 510 is for the supplier A. The detector 520 is for the supplier B. The detector 530 is for the supplier C. The detector 540 is for the supplier D.

Each of the detectors includes an operational amplifier AMP, and resistors R1, R2, and R3. For example, the resistance values of the resistors R2, R3 are about 10 kΩ. A power supply voltage V1 of the operational amplifier AMP is, for example, 5 V. A pull-up voltage V2 of the resistor R3 is, for example, 5 V. Each of the detectors is preferably a hysteresis comparator.

The four detectors 510, 520, 530, and 540 are different from each other in the resistance value of the resistor R1. In other words, the resistance values of the resistors R1 vary among the multiple types of brushless DC motors. For example, 5.1 kΩ, may be allocated to the resistance value of the resistor R1 in the detector 510. For example, 6.1 kΩ may be allocated to the resistance value of the resistor R1 in the detector 520. For example, 7.2 kΩ may be allocated to the resistance value of the resistor R1 in the detector 530. For example, 8.5 kΩ may be allocated to the resistance value of the resistor R1 in the detector 540.

Among the four detectors 510, 520, 530 and 540, the reference voltages Vref for the operational amplifiers AMP can be varied with the different resistance values exclusively allocated to the resistors R1. This resultantly enables adjustment of a voltage input level with which each detector can react. Multiple reference voltages Vref are allocated to the respective types of brushless DC motors.

(Step S310B) The identification voltage value received from the brushless DC motor 200 and the multiple reference voltages Vref are inputted to the comparator 500 to obtain a comparison result.

Each operational amplifier AMP outputs an output signal OUT depending on which one is higher between the input voltage and the reference voltage Vref. When the input voltage is equal to or lower than the reference voltage Vref, the operational amplifier AMP outputs a signal at a low level. When the input voltage is higher than the reference voltage Vref, the operational amplifier AMP outputs a signal at a high level.

(Step S320B) In the present embodiment, a reference voltage Vref4 for the detector 510 is, for example, 3.3 V. A reference voltage Vref3 for the detector 520 is, for example, 3.1 V. A reference voltage Vref2 for the detector 530 is, for example, 2.9 V. A reference voltage Vref1 for the detector 540 is, for example, 2.7 V. For example, with an input voltage at 3.0 V from a brushless DC motor of the supplier B, the detectors 530, 540 react but the detectors 510, 520 do not react. A comparison result obtained with the input voltage at 3.0 V includes OUT1, OUT2 at the low level and OUT3, OUT4 at the high level. The controller 110 can identify the brushless DC motor to be identified as the supplier B type based on this comparison result. The OUT1, OUT2, OUT3, and OUT4 denote output signals outputted from the detectors 510, 520, 530, and 540, respectively.

For example, if the OUT1, OUT2, and OUT3 are at the low level while the OUT4 is at the high level, the controller 110 can identify the supplier C type based on this comparison result. For example, if the OUT1 is at the low level while the OUT2, OUT3 and OUT4 are at the high level, the controller 110 can identify the supplier A type based on this comparison result. For example, if all the OUT1, OUT2, OUT3 and OUT4 are at the high level, the controller 110 cannot identify any of the supplier types based on this comparison result, but thereby can detect that no brushless DC motor is connected.

FIG. 9 illustrates another specific example of a flowchart of the identification method of identifying a type of brushless DC motor 200.

As illustrated in FIG. 9, the identification method according to the present embodiment may further include a step of providing a notification of an identification result of the type of brushless DC motor 200 (S400).

As one example of a notification method, the multiple light emitters illustrated in FIG. 3, for example, the multiple LEDs 130 may be used to provide a notification of an identification result of the type of brushless DC motor 200. Based on the identification result of the type of brushless DC motor 200, the controller 110 of the identification apparatus 100 selects the LED 130 allocated to the brushless DC motor 200 to be identified from among the multiple LEDs 130 allocated to the respective types of brushless DC motors, and causes the selected LED 130 to emit light. Incidentally, the light emitter is not limited to an LED, but may be any element capable of providing a notification by using light.

For example, a red LED may be allocated for the A supplier, a blue LED may be allocated for the B supplier, and a green LED may be allocated for the C supplier. When identifying the brushless DC motor of the C supplier, the controller 110 of the identification apparatus 100 can cause the green LED to emit light. With this, an operator in a factory, for example, can visually recognize whether or not the brushless DC motor to be identified is the motor of the C supplier.

As another example, the outputs OUT1, OUT2, OUT3, and OUT4 from the comparator 500 may be electrically connected to the LEDs via semiconductor open-collector switching elements, and a predetermined number of the LEDs may be caused to emit light depending on the signal levels of the outputs OUT. For example, an operator can visually recognize the type of brushless DC motor 200 from a combination of LEDs 130 emitting light among the multiple LEDs 130.

As another example, a display device (for example, a liquid crystal display), a speaker, or the like may be used to provide a notification of an identification result of the type of brushless DC motor 200. For example, the identification result may be displayed as text information on the liquid crystal display. For example, the speaker may make a sound from among sounds different in pitch among the types of brushless DC motors.

As another example, the controller 110 of the identification apparatus 100 may once write the identification result to the memory 120, or transmit the identification result to another apparatus or device that needs the identification result. These modes are also examples of the identification result notification.

According to the present embodiment, when a brushless DC motor 200 is powered on, for example, the identification pull-up voltage value Vpu set by the pull-up resistance 310 is automatically outputted from the PWM terminal. The identification apparatus 100 only has to receive the outputted identification voltage value. There is no need to perform the conventionally necessary operations such as communications by handshaking between the identification apparatus 100 and the brushless DC motor 200. In addition, the method can use the existing terminal and does not need new provision of a terminal dedicated to the identification. A decrease in the number of components can result in a decrease in product costs.

For example, the brushless DC motor 200 may further include a terminal which is used as an input terminal when the brushless DC motor 200 is in operation and which includes a pull-up resistance incorporated therein, in addition to the PWM terminal 300, the SDATA terminal and the SCLK terminal. For example, the terminal may be equipped with another specific resistance as in the PWM terminal 300. The identification voltage values outputted from the PWM terminal 300 and the aforementioned terminal are inputted to the identification apparatus 100. For example, the identification apparatus 100 may perform AD conversion of the two identification voltage values to obtain two unique information pieces, each of which is one of three predetermined unique information pieces. Then, the identification apparatus 100 may identify the type of brushless DC motor 200 based on the obtained combination of the unique information pieces among all the combinations of the three unique information pieces. Use of two terminals enables identification of 9 types of motors. For example, use of three terminals enables identification of 27 types of motors. In this way, an increase in the number of terminals used for the identification can lead to an increase in the number of identifiable types of motors.

The identification method of the present disclosure may be also advantageously used not only in product manufacturing processes but also in other processes such, for example, as one to replace a brushless DC motor having a failure with a new one. It is possible to confirm whether the new brushless DC motor after the replacement is compatible with the system or not. Moreover, for example, products equipped with brushless DC motors are connected to the Internet. In this case, what is termed Internet of Things (IoT) is established. For example, each of the suppliers of the products equipped with brushless DC motors can identify the product equipped with a particular brushless DC motor by analyzing big data including the unique information pieces of brushless DC motors. This enables quality stabilization by preventing the occurrence of a trouble or doing the like.

FIG. 10 schematically illustrates a typical block configuration example of a user system 100, an identification apparatus 100A, and a brushless DC motor 200 according to Embodiment 2.

The identification apparatus 100A according to the present embodiment is an apparatus separated from the user system 100 unlike Embodiment 1. The identification apparatus 100A includes, for example, an MCU 110A and an LED 130. The identification apparatus 100A includes, for example, a Vmot terminal, a GND terminal, and a PWM terminal as terminals necessary for identifying types of brushless DC motors 200.

The user system 100, the identification apparatus 100A, and the brushless DC motor 200 are electrically connected to each other via the Vmot terminals, the GND terminals, and the PWM terminals. Thus, any one of the user system 100 and the identification apparatus 100A can supply a power supply voltage to the brushless DC motor 200 via the Vmot terminals. A PWM signal can be transmitted from the identification apparatus 100A to the brushless DC motor 200.

Upon power-on, an identification voltage value outputted from the PWM terminal 300 is inputted to the PWM terminal of the identification apparatus 100A. For example, the MCU 110A can identify the type of brushless DC motor 200 based on the acquired identification voltage value in accordance with the processing flow illustrated in FIG. 5A. Moreover, the MCU 110A may transmit the identification result to the controller 110 of the user system 100.

FIG. 11 schematically illustrates another block configuration example of the user system 100, the identification apparatus 100A, and the brushless DC motor 200.

The identification apparatus 100A is electrically connected to the user system 100 and the brushless DC motor 200 via, for example, test points (TP). TP1 is a TP for motor power supply. TP2 is a TP for PWM signal. TP3 is a TP for GND. A special-purpose probe is connected to the identification apparatus 100A, and a type of brushless DC motor 200 can be identified by bringing the probe into contact with the TPs.

The brushless DC motor 200 in the present embodiment includes a circuit board CB on which at least one terminal including a pull-up resistance 310 incorporated therein (for example, the PWM terminal 300), and at least one terminal with an open-collector or open-drain output function (for example, the TACH terminal) are mounted. The pull-up resistances 310 of the PWM terminals 300 vary among multiple types of brushless DC motors as described above.

According to the present embodiment, it is possible to identify a type of brushless DC motor 200 by referring to the LUT for example described above, while using the identification voltage value outputted from the TACH terminal and the pull-up voltage value outputted from the PWM terminal 300 of the of brushless DC motor 200.

For example, the identification apparatus 100 may perform AD conversion of the identification voltage value and the pull-up voltage value to obtain two unique information pieces, each of which is one of three preset unique information pieces. Then, the identification apparatus 100 may identify the type of brushless DC motor 200 based on the obtained combination of the unique information pieces from among all the combinations of the three unique information pieces. Thus, various combinations of at least one terminal including a pull-up resistance 310 incorporated therein and at least one terminal with an open-collector or open-drain output function can be used as terminals for identification.

General description of an embodiment of the present disclosure is provided below.

An identification method according to an exemplary embodiment of the present disclosure is an identification method for use in, for example, an identification apparatus 100 that identifies types of brushless DC motors 200. For example, as described with reference to FIGS. 1 and 2C, each brushless DC motor 200 includes a circuit board CB on which at least one terminal including a pull-up resistance 310 incorporated therein, for example, a PWM terminal 300 is mounted. The pull-up resistances 310 vary among multiple types of brushless DC motors. As described with reference to FIG. 4, for example, the identification method for the brushless DC motor 200 includes: supplying a power supply voltage Vmot from the identification apparatus 100 to the brushless DC motor 200; inputting to the identification apparatus 100 a pull-up voltage value set by the pull-up resistance 310 and outputted from the PWM terminal 300 of the brushless DC motor 200; and identifying a type of the brushless DC motor 200 based on the pull-up voltage value.

According to the identification method as described above, each of multiple types of brushless DC motors is configured to output an exclusively allocated pull-up voltage value set by the pull-up resistance 310, and this exclusive allocation enables identification of suppliers, products, or production lots.

In an embodiment, the circuit board CB includes, for example, a voltage divider circuit 320 that is connected to a PWM terminal of the identification apparatus 100, and that includes the pull-up resistance 310 and pull-down resistances 311, 312. The pull-up voltage value is at a potential level of a node connecting the pull-up resistance 310 and the pull-down resistance 311.

According to the identification method as described above, the pull-up voltage value stable at the potential level of the node can be obtained.

In an embodiment, the identification apparatus 100 performs AD conversion of the pull-up voltage value to obtain a unique information piece of the brushless DC motor 200, and the identifying a type of the brushless DC motor 200 includes identifying the type of the brushless DC motor to be identified, based on the obtained unique information piece by referring to the LUT illustrated in FIG. 5B, for example, in which multiple types of brushless DC motors are associated with multiple unique information pieces of brushless DC motors, the unique information pieces each allocated to one of the types of brushless DC motors.

According to the identification method as described above, the controller 110 of the identification apparatus 100 can identify the type of the brushless DC motor 200 to be identified based on the obtained unique information piece by referring to the table.

In an embodiment, each of the unique information pieces of brushless DC motors is expressed by a digital value with a predetermined bit width, and a set of unique information pieces is grouped by a certain range of multiple digital values. The multiple digital values do not have overlap among the sets of the unique information pieces of brushless DC motors.

According to the identification method as described above, each of the multiple unique information pieces of brushless DC motors is expressed by using, for example, a 10-bit digital value, and a set of unique information pieces is grouped by a certain range of multiple digital values. Since the multiple digital values do not have overlap among the sets of the unique information pieces of brushless DC motors, reliable identification by referring to the table can be attained.

In an embodiment, the identification method for the brushless DC motor 200 further includes: inputting the identification voltage value and multiple reference voltages Vref allocated to the respective types of brushless DC motors to the comparator 500 to obtain a comparison result, and the identifying a type of the brushless DC motor 200 includes identifying the type of the brushless DC motor 200 to be identified based on the comparison result of the comparator 500.

According to the identification method as described above, it is possible to identify the type of the brushless DC motor 200 to be identified based on the comparison result of the comparator 500.

In an embodiment, the at least one terminal of the circuit board CB is used as, for example, an input terminal when the brushless DC motor 200 is in operation as described with reference to FIG. 1 or 3.

The identification method as described above may use various input terminals that are used as input terminals when the brushless DC motor 200 is in operation.

In an embodiment, the at least one terminal of the circuit board CB is, for example, a PWM terminal 300 for controlling the number of rotations of the brushless DC motor 200.

According to the identification method as described above, it is possible to identify a type of brushless DC motor having the simplest configuration including the PWM terminal 300.

In an embodiment, the terminal of the identification apparatus 100 connected to the at least one terminal of the circuit board CB is an input/output terminal. For example, the PWM terminal of the identification apparatus 100 is an input/output terminal including a 3-state buffer 710 illustrated in FIG. 2A.

According to the identification method as described above, for example, the input and output attributes of the terminal can be switched between the identification mode and the normal operating mode by the controller 110, and therefore the existing PWM terminal can be used also for the identification.

In an embodiment, the at least one terminal of the circuit board CB includes multiple terminals that are used as input terminals when the brushless DC motor 200 is in operation.

According to the identification method as described above, for example, the PWM terminal, the SDATA terminal, and the SCLK terminal are usable as the multiple input terminals as explained above, and accordingly a larger number of types of motors can be identified.

In an embodiment, the identification method for the brushless DC motor 200 further includes providing a notification of an identification result of the type of the brushless DC motor.

According to the identification method as described above, for example, the controller 110 of the identification apparatus 100 may once write the identification result to the memory 120 or may transmit the identification result to another apparatus or device needing the identification result as explained above. In addition, it is possible to provide a notification of the identification result of the type of the brushless DC motor 200 by using a display device (for example, a liquid crystal display), a speaker, and so on.

In an embodiment, the identification method for the brushless DC motor 200 further includes: based on the identification result of the type of the brushless DC motor, selecting a light emitter 130 allocated to the brushless DC motor 200 to be identified from among multiple light emitters 130 allocated to the multiple types of brushless DC motors, and causing the selected light emitter 130 to emit light.

According to the identification method as described above, for example, a red LED may be allocated for the supplier A, a blue LED may be allocated for the supplier B, and a green LED may be allocated for the supplier C. When identifying the brushless DC motor of the supplier C, the controller 110 of the identification apparatus 100 can cause the green LED to emit light.

In an embodiment, the brushless DC motor 200 is, for example, a DC fan including an impeller.

According to the identification method as described above, it is possible to identify types of brushless DC motors 200 such as an axial fan, a centrifugal fan, a cross-flow fan, and a sirocco fan, for example.

An identification apparatus 100 in an exemplary embodiment of the present disclosure is an identification apparatus that identifies types of brushless DC motors 200. For example, as described with reference to FIGS. 1 and 2C, each brushless DC motor 200 includes a circuit board CB on which at least one terminal including a pull-up resistance 310 incorporated therein, for example, a PWM terminal 300 is mounted. The pull-up resistances 310 vary among multiple types of brushless DC motors. The identification apparatus 100 includes a power supply terminal to supply a power supply voltage Vmot to the brushless DC motor 200, a PWM input/output terminal connected to the PWM terminal 300 of the circuit board CB, and a controller 110 that identifies a type of the brushless DC motor 200. The controller 110 acquires a pull-up voltage value via the PWM input/output terminal and identifies the type of the brushless DC motor 200 based on the pull-up voltage value. Here, the pull-up voltage value is set by the pull-up resistance 310 and outputted from the PWM terminal 300 of the circuit board CB when the power supply voltage Vmot is supplied to the brushless DC motor 200 via the power supply terminal.

The identification apparatus as described above operates under the setting in which each of types of brushless DC motors is configured to output an exclusively allocated pull-up voltage value set by the pull-up resistance 310, and this exclusive allocation enables identification of suppliers, products, or production lots.

A brushless DC motor 200 in an exemplary embodiment of the present disclosure includes, for example as described with reference to FIG. 1: a circuit board CB; a PWM terminal 300 that is mounted on the circuit board CB and that includes a pull-up resistance 310 incorporated therein; a coil 240; and a drive circuit that causes electricity to flow through the coil 240. The pull-up resistances 310 vary among multiple types of brushless DC motors.

With the brushless DC motor as described above, each of multiple types of brushless DC motors includes an exclusively allocated pull-up resistance 310, and this exclusive allocation enables identification of suppliers, products, or production lots.

Embodiments of the present disclosure may be used in a wide variety of instruments including various fan motors, such for example as personal computers, game devices, cleaners, dryers, washing machines, and refrigerators.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An identification method for use in an identification apparatus that identifies a type of brushless DC motor, wherein
the brushless DC motor includes a circuit board on which at least one terminal with a pull-up resistance incorporated therein is mounted,
the pull-up resistances vary among a plurality of types of brushless DC motors, and
the method comprises:
supplying a power supply voltage from the identification apparatus to the brushless DC motor;
inputting a pull-up voltage value to the identification apparatus, the pull-up voltage value set by the pull-up resistance and outputted from the at least one terminal of the brushless DC motor; and
identifying a type of the brushless DC motor based on the pull-up voltage value.

2. The identification method according to claim 1, wherein
the circuit board includes a voltage divider circuit that is connected to a terminal of the identification apparatus and that includes the pull-up resistance and a pull-down resistance, and
the pull-up voltage value is at a potential level of a node connecting the pull-up resistance and the pull-down resistance.

3. The identification method according to claim 1, wherein the identification apparatus performs AD conversion of the pull-up voltage value to obtain a unique information piece of the brushless DC motor, and
the identifying a type of the brushless DC motor includes identifying the type of the brushless DC motor to be identified, based on the obtained unique information piece by referring to a table in which the plurality of types of brushless DC motors are associated with a plurality of unique information pieces of brushless DC motors, the unique information pieces each allocated to one of the plurality of types of brushless DC motors.

4. The identification method according to claim 3, wherein
each of the unique information pieces of brushless DC motors is expressed by a digital value with a predetermined bit width, and a set of unique information pieces is grouped by a certain range of a plurality of digital values, and
the pluralities of digital values do not have overlap among the sets of the unique information pieces of brushless DC motors.

5. The identification method according to claim 1, further comprising:
inputting the pull-up voltage value and a plurality of reference voltages allocated to the respective types of brushless DC motors to a comparator to obtain a comparison result; and
identifying the type of the brushless DC motor to be identified based on the comparison result of the comparator.

6. The identification method according to claim 1, wherein the at least one terminal of the circuit board is a terminal to be used as an input terminal when the brushless DC motor is in operation.

7. The identification method according to claim 6, wherein the at least one terminal of the circuit board is a terminal to controlling the number of rotations of the brushless DC motor.

8. The identification method according to claim 1, wherein a terminal of the identification apparatus connected to the at least one terminal of the circuit board is an input/output terminal.

9. The identification method according to claim 1, wherein the at least one terminal of the circuit board includes a plurality of output terminals to be used as input terminals when the brushless DC motor is in operation.

10. The identification method according to claim 1, wherein the identification apparatus further provides a notification of an identification result of the type of the brushless DC motor.

11. The identification method according to claim 1, further comprising, based an identification result of the type of the brushless DC motor, selecting a light emitter allocated to the brushless DC motor to be identified from among a plurality of light emitters allocated to the plurality of types of brushless DC motors, and causing the selected light emitter to emit light.

12. The identification method according to claim 1, wherein the brushless DC motor is a fan motor including an impeller.

13. An identification apparatus that identifies a type of brushless DC motor, wherein
the brushless DC motor includes a circuit board on which at least one terminal with a pull-up resistance incorporated therein is mounted,
the pull-up resistances vary among a plurality of types of brushless DC motors,
the identification apparatus comprises:

a power supply terminal that supplies a power supply voltage to the brushless DC motor;

an input/output terminal that is connected to the at least one terminal of the circuit board; and a controller that identifies the type of the brushless DC motor, the controller acquires, via the input/output terminal, a pull-up voltage value set by the pull-up resistance and outputted from the at least one terminal of the circuit board when the power supply voltage is supplied to the brushless DC motor via the power supply terminal, and the controller identifies the type of the brushless DC motor based on the pull-up voltage value.

* * * * *